US008379163B2

(12) United States Patent
Oohira (10) Patent No.: US 8,379,163 B2
(45) Date of Patent: Feb. 19, 2013

(54) DISPLAY DEVICE

(75) Inventor: Eiji Oohira, Mobara (JP)

(73) Assignees: Hitachi Displays, Ltd., Chiba (JP); Pansonic Liquid Crystal Display Co., Ltd., Hyogo-ken (JP)

( * ) Notice: Subject to any disclaimer, the term of this patent is extended or adjusted under 35 U.S.C. 154(b) by 224 days.

(21) Appl. No.: 12/876,280

(22) Filed: Sep. 7, 2010

(65) Prior Publication Data

US 2011/0058120 A1   Mar. 10, 2011

(30) Foreign Application Priority Data

Sep. 7, 2009   (JP) .................................. 2009-205452

(51) Int. Cl.
*G02F 1/1333*   (2006.01)
*H05K 1/00*   (2006.01)

(52) U.S. Cl. ............ 349/56; 349/58; 349/139; 349/150; 349/152; 361/749

(58) Field of Classification Search .................... 349/56, 349/58, 61, 139, 140, 141, 149, 150, 151, 349/152; 361/749
See application file for complete search history.

(56) References Cited

U.S. PATENT DOCUMENTS

| | | | | |
|---|---|---|---|---|
| 7,542,105 | B2 * | 6/2009 | Sato et al. ........................ | 349/58 |
| 8,199,517 | B2 * | 6/2012 | Cho et al. ....................... | 361/767 |
| 2007/0222912 | A1 * | 9/2007 | Sato et al. ........................ | 349/58 |
| 2009/0308638 | A1 * | 12/2009 | Cho et al. ....................... | 174/254 |
| 2010/0283955 | A1 * | 11/2010 | Kim et al. ..................... | 349/149 |
| 2011/0058120 | A1 * | 3/2011 | Oohira ............................ | 349/61 |

FOREIGN PATENT DOCUMENTS

JP   07-092480   4/1995

* cited by examiner

*Primary Examiner* — Brian Healy
(74) *Attorney, Agent, or Firm* — Antonelli, Terry, Stout & Kraus, LLP.

(57) ABSTRACT

A display device includes: a first substrate which constitutes a display panel; and a flexible printed circuit board which is connected to the first substrate. The flexible printed circuit board is electrically and mechanically connected with terminals formed on the first substrate. The flexible printed circuit board includes a board portion, a wiring layer which is mounted on the board portion, and a cover portion which covers the wiring layer. The wiring layer includes a connecting portion which is electrically and mechanically connected to a terminal portion formed on the first substrate. The cover portion is removed at the connecting portion, and the cover portion in the vicinity of the connecting portion overlaps with the first substrate. The cover portion in the vicinity of the connecting portion is fixed to the first substrate.

7 Claims, 6 Drawing Sheets

DISPLAY DEVICE

CROSS-REFERENCE TO RELATED APPLICATIONS

This present application claims priority from Japanese application JP 2009-205452 filed on Sep. 7, 2009, the content of which is hereby incorporated by reference into this application.

BACKGROUND OF THE INVENTION

1. Field of the Invention

The present invention relates to an electronic device, and more particularly to a technique which is effectively applicable to an electronic device having a flexible printed circuit board such as a display device, for example.

2. Description of the Related Art

A liquid crystal display device (also referred to as "liquid crystal display module") which includes a small-sized TFT (Thin Film Transistor)-type liquid crystal display panel has been popularly used as a display part of a portable device such as a mobile phone.

In general, a liquid crystal display device includes a liquid crystal display panel and a backlight which radiates light to the liquid crystal display panel. In a liquid crystal display device which is used as a display part of a portable device such as a mobile phone, a backlight is constituted of a resin frame mold (hereinafter, referred to as "mold"), a group of optical sheets which is arranged in the inside of the mold, a light guide plate, and a reflection sheet which is arranged below the light guide plate. Further, the liquid crystal display panel is constituted of a first substrate (for example, a glass substrate or the like), a second substrate, and liquid crystal which is sandwiched between the first substrate and the second substrate.

That is, the liquid crystal display device used in the mobile phone is configured such that the first substrate which constitutes the liquid crystal display panel is fixed to the frame-shaped mold by adhesion, and light radiated from the backlight arranged below the liquid crystal display panel is allowed to pass through the liquid crystal display panel. Here, a semiconductor chip which constitutes a driver IC for driving liquid crystal and a flexible printed circuit board (FPC) which transmits electricity and video data to the first substrate are adhered to the first substrate by way of an anisotropic conductive film.

Figure 4:
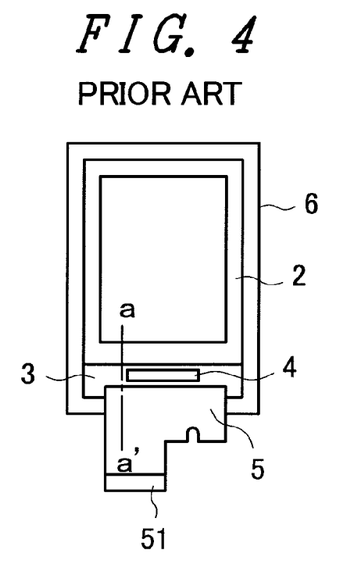
FIG. 4 is a plan view of a conventional liquid crystal display device.
Figure 5:
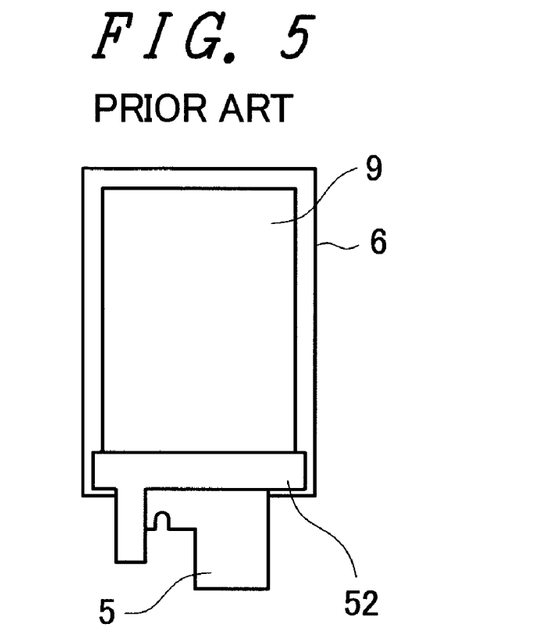
FIG. 5 is a bottom plan view of the conventional liquid crystal display device.

FIG. 4 is a plan view of a conventional liquid crystal display device, and FIG. 5 is a bottom plan view of the conventional liquid crystal display device. Further, FIG. 6 is a cross-sectional view showing the cross-sectional structure taken along a line a-a' in FIG. 4.

Figure 6:
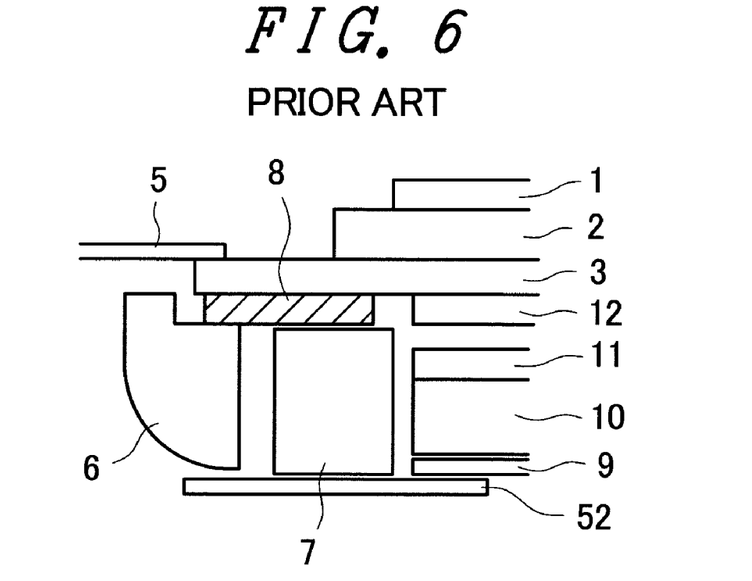
FIG. 6 is a cross-sectional view showing the cross-sectional structure taken along a line a-a' in FIG. 4.

In FIG. 4 to FIG. 6, symbol 1 indicates an upper polarizer, symbol 2 indicates a second substrate (also referred to as "CF substrate"), symbol 3 indicates a first substrate (also referred to as "TFT substrate"), symbol 4 indicates a semiconductor chip, symbol 5 indicates a flexible printed circuit board (hereinafter, referred to as "FPC"), symbol 6 indicates a resin frame mold, symbol 7 indicates white light emitting diodes which function as a light source, symbol 8 indicates a light blocking tape, symbol 9 indicates a reflection sheet, symbol 10 indicates a light guide plate, symbol 11 indicates a group of optical sheets, and symbol 12 indicates a lower polarizer.

The FPC 5 which is adhered to respective terminals of the first substrate 3 of the liquid crystal display panel may be used in a straightly extending manner. However, in general, in a mobile phone or the like which does not have a large margin in a longitudinal size thereof, as shown in FIG. 4 and FIG. 5, it is often the case where the FPC 5 is used while being folded to a rear side of the resin frame mold 6. Here, the FPC 5 is connected to a phone body via an interface terminal portion 51. Further, a portion 52 of the FPC 5 which is folded to the rear side of the resin frame mold 6 is an LED mounting portion on which the white light emitting diodes 7 constituting a light source are mounted.

As shown in FIG. 4 and FIG. 5, in the conventional liquid crystal display panel, respective terminals formed on an edge portion of one side of the first substrate 3 and a wiring layer of the FPC 5 are connected to each other using an anisotropic conductive film (ACF) in general. Such a display device is disclosed in JP-A-7-92480.

SUMMARY OF THE INVENTION

Figure 7A:
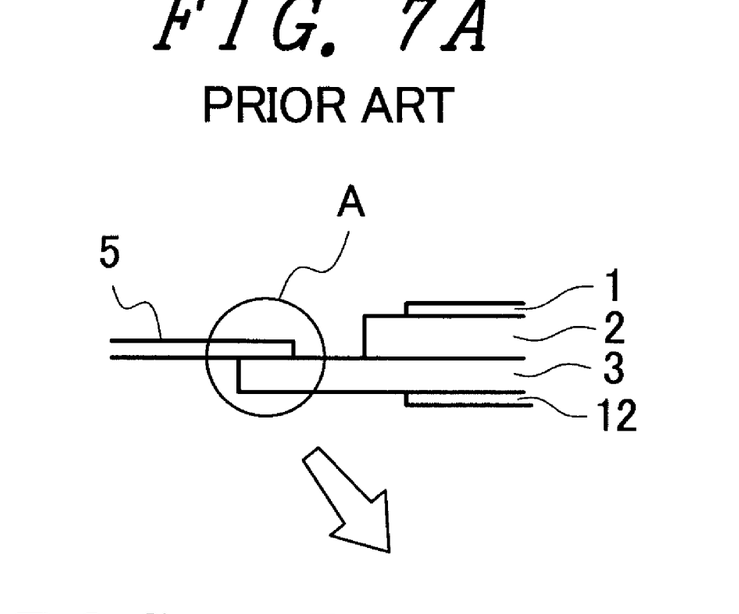
FIG. 7A and FIG. 7B are views for explaining a connecting portion between a first substrate and a flexible printed circuit board shown in FIG. 4 and FIG. 6.
Figure 7B:
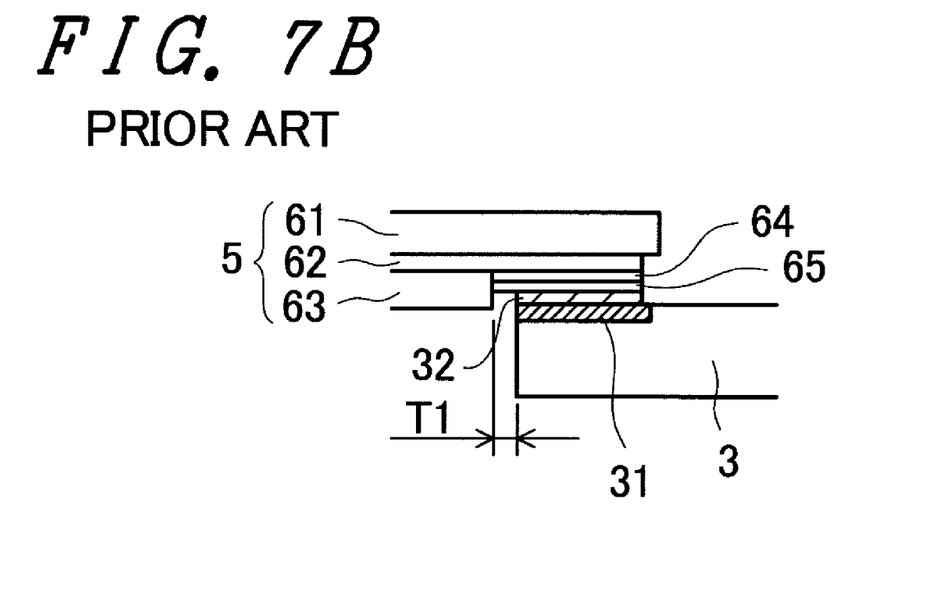

FIG. 7A and FIG. 7B are views for explaining a connecting portion between the first substrate 3 and the FPC 5 shown in FIG. 4 and FIG. 6, wherein FIG. 7A is a view showing only the connecting portion between the first substrate 3 and the FPC 5 shown in FIG. 4 and FIG. 6, and FIG. 7B is a view showing a portion indicated by symbol A in FIG. 7A in an enlarged manner.

As shown in FIG. 7A and FIG. 7B, the FPC 5 is constituted of a board portion 61, a wiring pattern layer 62 made of Cu which is formed on the board portion 61, and a cover portion 63. Here, at a connecting portion of the wiring pattern layer 62 which is connected to respective terminals 31 of the first substrate 3, the cover portion 63 on the wiring pattern layer 62 is removed. On a portion of the wiring pattern layer 62 from which the cover portion 63 is removed, a Ni layer 64 is formed. An Au layer 65 is formed on the Ni layer 64.

Further, as shown in FIG. 7A and FIG. 7B, the cover portion 63 on the wiring pattern layer 62 does not overlap with the respective terminals 31 of the first substrate 3. The respective terminals 31 which are mounted on an edge portion of one side of the first substrate 3 and the wiring layer of the FPC 5 are connected with each other using an anisotropic conductive film (ACF) 32 such that a distance (T1 in FIG. 7B) between the cover portion 63 and one side of the first substrate 3 is set to approximately 0.3 mm.

A most area of the wiring pattern layer 62 in the FPC 5 is sandwiched between the board portion 61 and the cover portion 63 of the FPC 5. On the other hand, in the connecting portion of the wiring pattern layer 62 connected with the first substrate 3, the cover member 63 is not provided, while the Ni layer 64 is formed on the wiring pattern layer 62 and the Au layer 65 is formed on the Ni layer 64.

Accordingly, a mechanical stress generated by bending of the FPC 5 is liable to be concentrated on the edge portion of the first substrate 3. Further, the Ni layer 64 which is hard and brittle is present at the edge portion, and the edge portion has plasticity.

Figure 8:
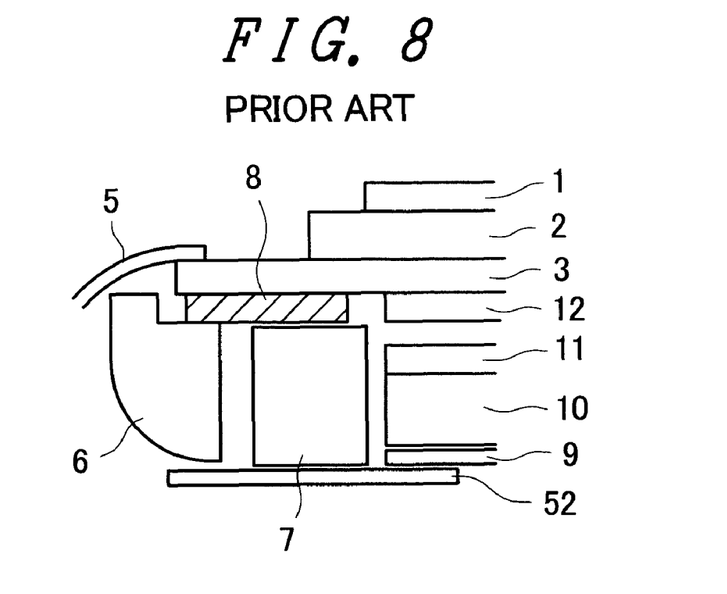
FIG. 8 is a cross-sectional view showing a state where a flexible printed circuit board is bent downward from an edge portion of a first substrate in a conventional liquid crystal display device.

FIG. 8 is a cross-sectional view showing a state where the FPC 5 is bent downward from the edge portion of the first substrate 3 in the conventional liquid crystal display device.

In a state shown in FIG. 8, although a compression stress is applied to the Ni layer 64, Ni exhibits much resistance to a compression stress and hence, no problem arises provided that the Ni layer 64 is bent by single bending (only one time). However, when a bending stress is repeatedly applied to the Ni layer 64, the Ni layer 64 suffers from metal fatigue resulting in the disconnection of the Ni layer 64.

Figure 9:
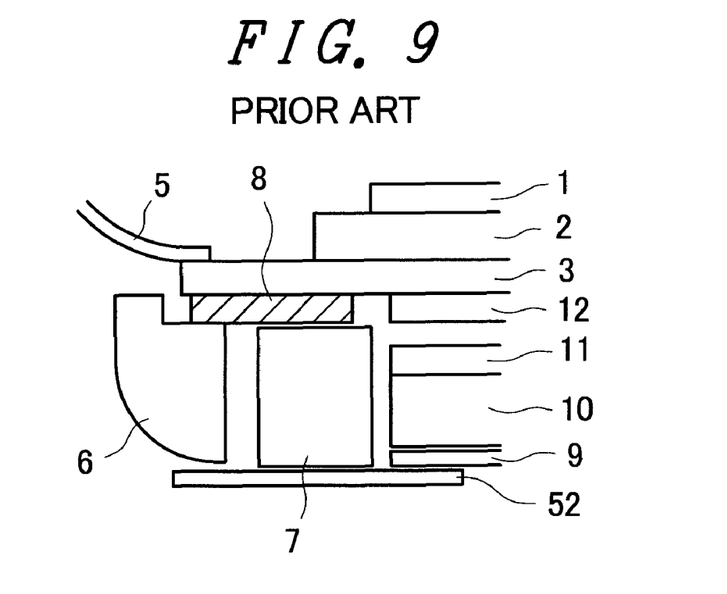
FIG. 9 is a cross-sectional view showing a state where the flexible printed circuit board is bent upward from the edge portion of the first substrate in the conventional liquid crystal display device.

FIG. 9 is a cross-sectional view showing a state where the FPC 5 is bent upward from the edge portion of the first substrate 3 in the conventional liquid crystal display device.

In a state shown in FIG. 9, a tensile stress is applied to the Ni layer 64. Ni exhibits extremely small resistance to a tensile stress and hence, the Ni layer 64 is far more easily disconnected compared to the case where the bending stress is applied to the Ni layer 64 as shown in FIG. 8.

The present invention has been made to overcome the above-mentioned drawbacks of the related art and it is an object of the present invention to provide a technique which can prevent, in an electronic device, the disconnection of a flexible printed circuit board which is connected to a first substrate at the time of bending the flexible printed circuit board.

The present invention is characterized in that the display device includes: a first substrate which constitutes a display panel; and a flexible printed circuit board which is connected to the first substrate, wherein the flexible printed circuit board includes a board portion, a wiring layer which is mounted on the board portion, a cover portion which covers the wiring layer, and a connecting portion which is connected to a terminal formed on the first substrate, the connecting portion includes a metal layer, and the cover portion overlaps with the first substrate.

The above-mentioned and other objects and novel features of the present invention will become apparent from the description of this specification and attached drawings.

To briefly explain the summary of typical inventions among inventions disclosed in this application, they are as follows.

(1) According to one aspect of the present invention, there is provided a display device which includes: a first substrate which constitutes a display panel; and a flexible printed circuit board which is connected to the first substrate, wherein the flexible printed circuit board includes a board portion, a wiring layer which is mounted on the board portion, a cover portion which covers the wiring layer, and a connecting portion which is electrically and mechanically connected to a terminal formed on the first substrate, the connecting portion includes a metal layer from which the cover portion is removed, and the cover portion is arranged in an overlapping manner with the first substrate.

(2) In the display device having the constitution (1), the cover portion in the vicinity of the connecting portion of the wiring layer is fixed to the first substrate.

(3) In the display device having the constitution (2), the cover portion in the vicinity of the connecting portion of the wiring layer is fixed to the first substrate using a resin or an adhesive agent.

(4) In the display device having the constitution (3), the cover portion in the vicinity of the connecting portion of the wiring layer is fixed to the terminal formed on the first substrate.

(5) In the display device having any one of the constitutions (1) to (4), a Ni layer is formed on a first-substrate-side surface of the connecting portion of the wiring layer, and the Ni layer has a thickness of 10 μm or more.

(6) In the display device having the constitution (1), the first substrate is a substrate which constitutes a display panel, the flexible printed circuit board is electrically and mechanically connected with the terminals formed on the first substrate at an edge portion of one arbitrary side of the first substrate, and the cover portion in the vicinity of the connecting portion of the wiring layer overlaps with the first substrate at the edge portion of said one arbitrary side of the first substrate.

(7) In the display device having the constitution (6), the cover portion in the vicinity of the connecting portion of the wiring layer is fixed to the first substrate at the edge portion of the one arbitrary side of the first substrate.

(8) In the display device having the constitution (7), the cover portion in the vicinity of the connecting portion of the wiring layer is fixed to the first substrate using a resin or an adhesive agent at the edge portion of the one arbitrary side of the first substrate.

(9) In the display device having the constitution (8), the cover portion in the vicinity of the connecting portion of the wiring layer is fixed to the terminal formed on the first substrate using a resin or an adhesive agent at the edge portion of the one arbitrary side of the first substrate.

(10) In the display device having any one of the constitutions (6) to (9), a Ni layer is formed on a first-substrate-side surface of the connecting portion of the wiring layer, and the Ni layer has a thickness of 10 μm or more.

(11) The display panel is a liquid crystal display panel, the display device includes a backlight which is arranged on a rear surface side of the liquid crystal display panel, the backlight includes a frame-shaped mold, and the flexible printed circuit board is folded and has a portion thereof arranged on a rear surface side of the frame-shaped mold.

(12) In the display device having the constitution (11), a semiconductor chip is mounted on the one arbitrary side of the first substrate.

To briefly explain advantageous effects obtained by the typical invention among the inventions disclosed in this application, they are as follows.

According to an electronic device of the present invention, it is possible to provide a technique which can prevent the disconnection of a flexible printed circuit board connected to the first substrate at the time of bending the flexible printed circuit board.

DETAILED DESCRIPTION OF THE DRAWINGS

BRIEF DESCRIPTION OF THE INVENTION

Hereinafter, an embodiment of the present invention is explained in detail in conjunction with drawings.

Here, in all drawings for explaining the embodiment, parts having identical functions are given same symbols and repeated explanations for them is omitted.

Figure 1:
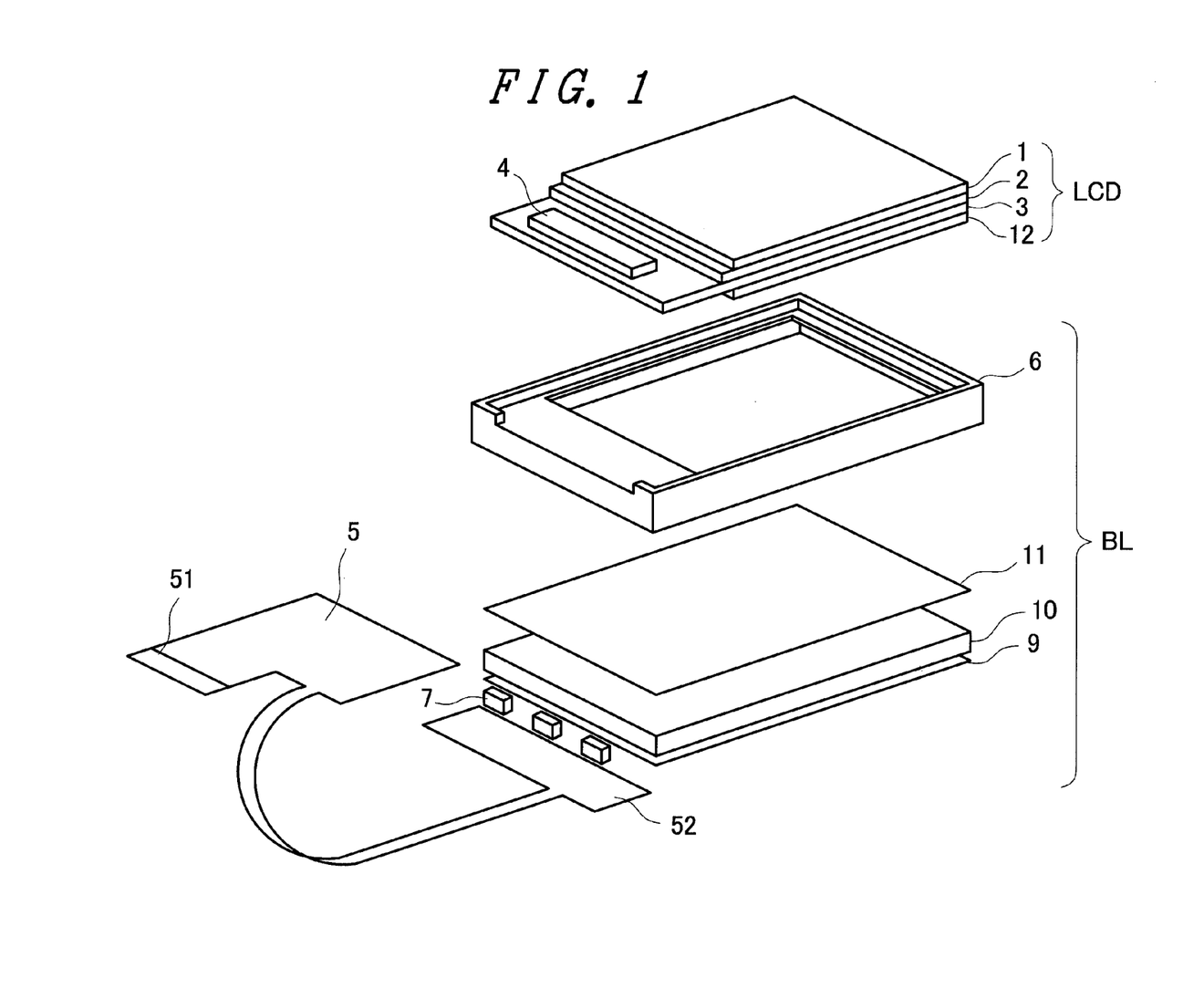
FIG. 1 is an exploded perspective view showing a liquid crystal display device according to an embodiment of the present invention.

FIG. 1 is an exploded perspective view showing a liquid crystal display device according to the embodiment of the present invention. Here, a plan view and a bottom plan view of the liquid crystal display device of this embodiment are equal to the plan view and the bottom plan view of the liquid crystal display device shown in FIG. 4 and FIG. 5.

In FIG. 1, symbol 1 indicates an upper polarizer, symbol 2 indicates a second substrate (also referred to as "CF substrate"), symbol 3 indicates a first substrate (also referred to as "TFT substrate"), symbol 4 indicates a semiconductor chip, symbol 5 indicates a flexible printed circuit board (FPC), symbol 6 indicates a resin frame mold (hereinafter, referred to as "mold"), symbol 7 indicates white light emitting diodes which function as a light source, symbol 9 indicates a reflection sheet, symbol 10 indicates a light guide plate, symbol 11 indicates a group of optical sheets, symbol 12 indicates a lower polarizer, symbol 51 indicates an interface terminal portion of the FPC 5, and symbol 52 indicates an LED mounting portion of the FPC 5.

A liquid crystal display panel LCD of this embodiment includes the first substrate 3, the second substrate 2, a liquid crystal layer (not shown in the drawing) which is sandwiched between the first substrate 3 and the second substrate 2, the semiconductor chip 4 on which a drive circuit is mounted, the FPC 5 which is connected to one side of the first substrate 3, the lower polarizer 12 which is adhered to the first substrate 3, and the upper polarizer 1 which is adhered to the second substrate 2. Here, a side of the second substrate 2 opposite to the liquid crystal layer constitutes a viewer's side.

The first and second substrates (2, 3) are formed of, for example, a transparent insulation substrate made of glass or the like. A long side of the first substrate 3 is larger than a long side of the second substrate 2 so that the first substrate 3 has a region where the first substrate 3 does not overlap with the second substrate 2 (hereinafter, referred to as "non-overlapping region"). The semiconductor chip 4 is mounted on the non-overlapping region of a liquid-crystal-layer-side surface of the first substrate 3.

Thin film transistors, pixel electrodes and the like are formed on the first substrate 3, and color filters and the like are formed on the second substrate 2. Here, counter electrodes are mounted on the first substrate 3 side in an IPS-type liquid crystal display panel, while the counter electrodes are mounted on the second-substrate-2 side in a TN-type or a VA-type liquid crystal display panel.

A backlight BL is constituted of a mold 6, the light source 7, a light guide plate 10, the group of optical sheets 11, and the reflection sheet 9.

As shown in FIG. 1, the light guide plate 10 is arranged in the inside of the mold 6, and the group of optical sheets 11 is arranged on the light guide plate 10. The reflection sheet 9 is arranged below the light guide plate 10. Further, the white light emitting diodes 7 which function as the light source are arranged on one side surface of the light guide plate 10. In FIG. 1, the white light emitting diodes 7 are mounted on the LED mounting portion 52 of the FPC 5.

Here, the group of optical sheets 11 is, for example, constituted of a lower diffusion sheet, two lens sheets and an upper diffusion sheet.

Figure 2A:
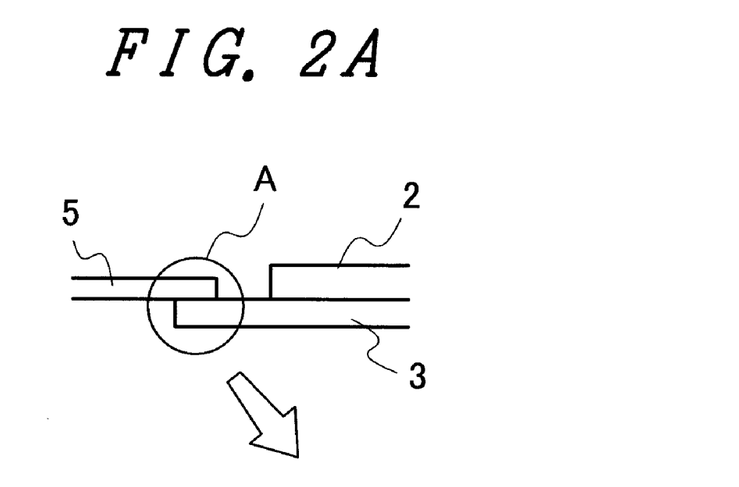
FIG. 2A and FIG. 2B are views for explaining a connecting portion between a first substrate and a flexible printed circuit board of the liquid crystal display device according to the embodiment of the present invention.
Figure 2B:
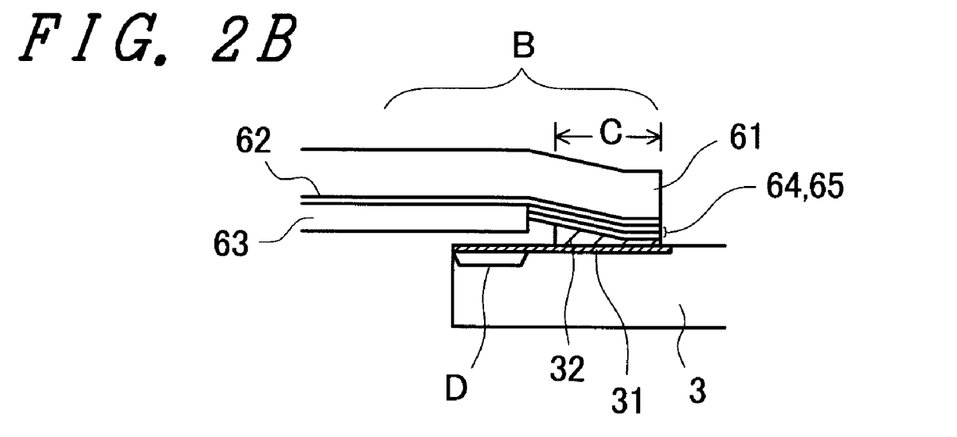

FIG. 2A and FIG. 2B are views for explaining a connecting portion between the first substrate 3 and the flexible printed circuit board 5 in the liquid crystal display device according to the embodiment of the present invention, wherein FIG. 2A is a view showing only the connecting portion between the first substrate 3 and the FPC 5 shown in FIG. 1, and FIG. 2B is a view showing a portion indicated by symbol A in FIG. 2A in an enlarged manner.

As shown in FIG. 7, in the conventional liquid crystal display device, the cover portion 63 of the FPC 5 does not overlap with the first substrate 3. To the contrary, this embodiment is characterized in that, as shown in FIG. 2B, a cover portion 63 of the FPC 5 partially overlaps with the first substrate 3 within a connecting region (a region B in FIG. 2B) of the FPC 5 and the first substrate 3. Here, symbol C in FIG. 2B indicates a pressurized region to which pressure is applied by a compression bonding bed which is used at the time of bonding the FPC 5 to the first substrate 3 by compression bonding.

After the FPC 5 is bonded to the first substrate 3 by compression bonding, an anisotropic conductive film 32 is formed such that a thickness of the anisotropic conductive film 32 is small at an edge portion side of the FPC 5 and is large at a cover portion 63 side of the FPC 5.

Due to such a constitution, in this embodiment, when the FPC 5 is bent downward, a portion to which a compression stress is applied becomes the cover portion 63. Accordingly, in the connecting portion of the FPC 5 and the first substrate 3, it is possible to prevent the disconnection of the wiring pattern at the edge portion of the first substrate 3 which has been feared conventionally and has been a task to be solved conventionally in terms of reliability.

Further, in this embodiment, a region (a region indicated by symbol D in FIG. 2B) of the cover portion 63 of the FCP 5 which overlaps with the first substrate 3 may be fixed to terminals 31 of the first substrate 3 using a resin or an adhesive agent.

Due to such fixing, in this embodiment, when the FPC 5 is bent upward, a portion to which a tensile stress is applied becomes the cover portion 63. Accordingly, in the connecting portion of the FPC 5 and the first substrate 3, it is possible to prevent the disconnection of the wiring pattern at the edge portion of the first substrate 3 which has been feared conventionally and has been a task to be solved conventionally in terms of reliability.

Further, in the conventional liquid crystal display device, to prevent the disconnection of the line attributed to a stress generated at the time of bending the FPC 5, the Ni layer 64 has a small thickness (being set to approximately 1 to 6 µm). The disconnection of the line can be suppressed by adopting the constitution of the present invention and hence, the Ni layer having a large thickness of 10 µm or more can be formed.

Accordingly, a control necessary for forming a thin Ni layer becomes unnecessary and hence, in this embodiment, a manufacturing cost of the FPC 5 can be reduced leading to the reduction of cost of the liquid crystal display device.

Figure 3A:
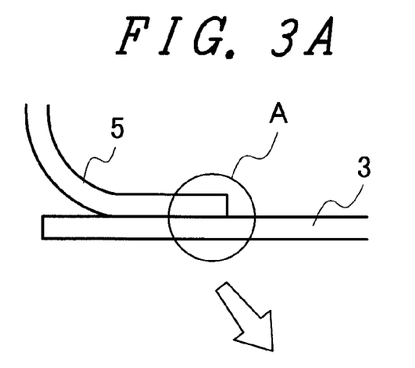
FIG. 3A and FIG. 3B are views for explaining a connecting portion between the first substrate and the flexible printed circuit board according to another embodiment of the present invention.
Figure 3B:
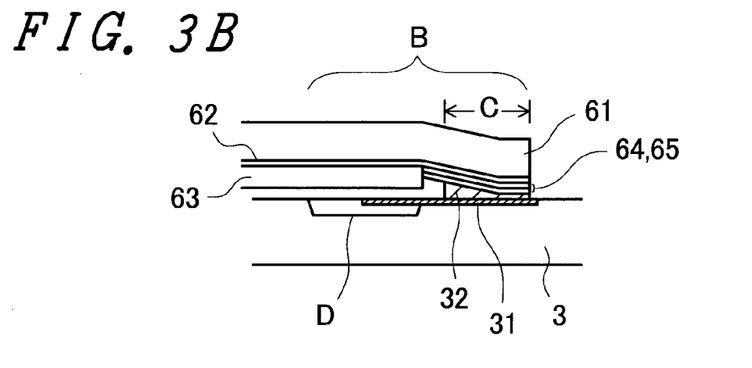

Here, in the explanation made heretofore, the explanation has been made with respect to the case where the FPC 5 is connected to the edge portion of the first substrate 3. However, the present invention is also applicable to a case where the FPC 5 is connected to a region other than the edge portion of the first substrate 3 (for example, a region in the vicinity of a center portion of the first substrate 3). FIG. 3A and FIG. 3B show an embodiment relating to such a case.

In the constitution shown in FIG. 3A and FIG. 3B, although there is no possibility that the FPC 5 is bent downward, by fixing a region of the cover portion 63 of the FPC 5 which overlaps with the first substrate 3 (a region indicated by symbol D in FIG. 3B) to the first substrate 3 or the terminals 31 of the first substrate 3 using a resin or an adhesive agent, when the FPC 5 is bent upward, a portion to which a tensile stress is applied becomes the cover portion 63. Accordingly, in the connecting portion of the FPC 5 and the first substrate 3, it is possible to prevent the disconnection of the wiring pattern at the edge portion of the first substrate 3 which has been feared conventionally and has been a task to be solved conventionally in terms of reliability.

In the same manner, also in the constitution in FIG. 3A and FIG. 3B, the Ni layer having a large thickness of 10 μm or more can be formed and hence, a control necessary for forming a thin Ni layer becomes unnecessary. Also in the constitution in FIG. 3A and FIG. 3B, a manufacturing cost of the FPC 5 can be reduced leading to the reduction of cost of the liquid crystal display device.

Here, in the explanations made heretofore, the explanation has been made with respect to the case where the present invention is applied to the liquid crystal display device. However, the present invention is not limited to the above-mentioned embodiments. For example, it is needless to say that the present invention is applicable to a display device such as an organic EL display device. It is also needless to say that the present invention is applicable to an electronic device which is provided with the first substrate 3 to which the FPC 5 is connected using a technique substantially equal to the technique adopted by the embodiments of the present invention.

Although the invention made by the inventors of the present invention has been specifically explained in conjunction with the embodiments heretofore, it is needless to say that the present invention is not limited to the above-mentioned embodiments and various modifications are conceivable without departing from the gist of the present invention.

What is claimed is:

1. A display device comprising:
    a first substrate which constitutes a display panel; and
    a flexible printed circuit board which is connected to the first substrate, wherein
    the flexible printed circuit board includes a board portion, a wiring layer which is mounted on the board portion, a cover portion which covers the wiring layer, and a connecting portion which is connected to a terminal formed on the first substrate,
    the connecting portion includes a metal layer, and
    the cover portion is arranged in an overlapping manner with the first substrate.

2. A display device according to claim 1, wherein the cover portion in the vicinity of the connecting portion is fixed to the first substrate using a resin or an adhesive agent.

3. A display device according to claim 1, wherein the cover portion in the vicinity of the connecting portion is fixed to the terminal formed on the first substrate.

4. A display device according to claim 1, wherein a Ni layer is formed on a first-substrate-side surface of the connecting portion, and the Ni layer has a thickness of 10 μm or more.

5. A display device according to claim 1, wherein the display panel is a liquid crystal display panel, the display device includes a backlight which is arranged on a rear surface side of the liquid crystal display panel, the backlight includes a frame-shaped mold, and the flexible printed circuit board is folded and has a portion thereof arranged on a rear surface side of the frame-shaped mold.

6. A display device according to claim 1, wherein the cover portion of the flexible printed circuit board is disposed so that at least a part of the cover portion directly opposes a surface of a first substrate in overlapping relationship therewith.

7. A display device according to claim 1, wherein the cover portion of the flexible printed circuit board is disposed at a lower surface of the board portion so that at least a part of the cover portion directly opposes an upper surface of the first substrate in overlapping relationship therewith.

* * * * *